United States Patent
Yoo et al.

(10) Patent No.: US 8,794,778 B2
(45) Date of Patent: Aug. 5, 2014

(54) TOP CHASSIS ASSEMBLY AND DISPLAY DEVICE HAVING THE SAME

(75) Inventors: Dong-Hyun Yoo, Asan-si (KR); Bo-Yeong Kim, Asan-si (KR); Jae-Won Kim, Asan-si (KR); Kyung-Ho Park, Asan-si (KR); Hyung-Jun Park, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/608,391

(22) Filed: Sep. 10, 2012

(65) Prior Publication Data

US 2013/0308296 A1 Nov. 21, 2013

(30) Foreign Application Priority Data

May 15, 2012 (KR) ......................... 10-2012-0051275

(51) Int. Cl.
*G09F 13/04* (2006.01)
(52) U.S. Cl.
CPC ..................................... *G06F 13/04* (2013.01)
USPC ......................................... 362/97.1; 362/633
(58) Field of Classification Search
USPC ................................. 362/97.1, 633
See application file for complete search history.

(56) References Cited

U.S. PATENT DOCUMENTS

| | | | | |
|---|---|---|---|---|
| 5,971,566 A | * | 10/1999 | Tani et al. | 362/294 |
| 7,077,554 B2 | * | 7/2006 | Kim et al. | 362/603 |
| 7,508,673 B2 | | 3/2009 | Kim et al. | |
| 7,880,095 B2 | * | 2/2011 | Kang et al. | 174/356 |
| 8,013,529 B2 | * | 9/2011 | Kang | 313/583 |
| 2005/0088093 A1 | * | 4/2005 | Kim et al. | 313/582 |
| 2006/0087224 A1 | * | 4/2006 | Oki et al. | 313/504 |
| 2006/0158075 A1 | * | 7/2006 | Lin et al. | 313/46 |
| 2007/0217223 A1 | * | 9/2007 | Ha et al. | 362/614 |
| 2007/0236910 A1 | * | 10/2007 | Yun et al. | 362/29 |
| 2009/0135331 A1 | * | 5/2009 | Kawase | 349/58 |
| 2010/0053049 A1 | | 3/2010 | Sato et al. | |
| 2011/0187692 A1 | | 8/2011 | Jung | |

FOREIGN PATENT DOCUMENTS

KR 1029876 B1 4/2011

* cited by examiner

*Primary Examiner* — Mary Ellen Bowman
(74) *Attorney, Agent, or Firm* — Cantor Colburn LLP (57) ABSTRACT

A top chassis assembly includes a top chassis and a contact unit. The top chassis surrounds a non-display area of a display panel. The non-display area includes a pad part through which a signal is provided to the display panel. The contact unit is disposed at an inner surface of the top chassis and contacts the pad part on the non-display area of the display panel.

18 Claims, 6 Drawing Sheets

TOP CHASSIS ASSEMBLY AND DISPLAY DEVICE HAVING THE SAME

This application claims priority to Korean Patent Application No. 10-2012-0051275, filed on May 15, 2012, and all the benefits accruing therefrom under 35 U.S.C. §119, the contents of which are herein incorporated by reference in their entirety.

BACKGROUND (1) Field

Exemplary embodiments of the invention relate to a top chassis assembly and a display device having the top chassis assembly. More particularly, exemplary embodiments of the invention relate to a top chassis assembly for realizing a narrow bezel of a display device and a display device having the top chassis assembly.

(2) Description of the Related Art

A range of application for liquid crystal display ("LCD") devices has gradually widened because of the LCD's excellent characteristics such as light weight, thin thickness and low power consumption. The LCD devices have been used in personal computers ("PC") such as notebook PCs, office automation equipment, audio/video equipment, interior/outdoor advertising display devices, and the like. A transparent type LCD device employed in many if not most of the LCD devices, controls an electric field applied to a liquid crystal layer and modulates light provided from a backlight assembly, thereby displaying images.

In the related art, a cold cathode fluorescent lamp ("CCFL"), a hot cathode fluorescent lamp ("HCFL"), an external electrode fluorescent lamp ("EEFL"), etc. were used as the light source of the backlight assembly. However, a light-emitting diode ("LED") has been spotlighted because the LED can be driven at a low voltage and has excellent characteristics such as low power consumption, excellent color reproduction, excellent contrast ratio, and a long life span.

An LCD device having a slim size and light weight has been developed in order to secure a competitiveness of a display device product. In the slim size and light weight LCD, for example, a bezel that is a width taken from a peripheral line or an outer edge of an LCD device to an active area of the LCD device is decreased, so that research for reducing a peripheral size of the LCD device to thereby reduce a width of the bezel is ongoing.

SUMMARY

One or more exemplary embodiments of the invention provide a top chassis assembly realizing a narrow bezel of a display device by omitting a bonding area of a display panel.

One or more exemplary embodiments of the invention provide a display device having the above-mentioned top chassis assembly.

According to an exemplary embodiment of the invention, a top chassis assembly includes a top chassis and a contact unit. The top chassis surrounds a non-display area of a display panel. The contact unit is disposed at an inner surface of the top chassis and contacts a pad part on the non-display area of the display panel.

In an exemplary embodiment, the contact unit may be a metal pad pattern. The metal pad pattern may be on the inner surface of the top chassis. The top chassis assembly may further include an insulation layer between the metal pad pattern and the top chassis. Moreover, the top chassis may include a nonconductive material. The nonconductive material may include polycarbonate ("PC").

In an exemplary embodiment, the contact unit may include a probe unit film, and a probe may be on the probe unit film. The probe unit film may be attached to the inner surface of the top chassis.

In an exemplary embodiment, the top chassis may include an upper plate defining a bezel of a display device. A width of the upper plate may be less than or equal to about 1 millimeter.

In an exemplary embodiment, the contact unit may have a barcode shape.

In an exemplary embodiment, the top chassis may include an upper plate, and a side plate which extends from the upper plate. The contact unit may be disposed on an inner surface of the upper plate and on an inner surface of the side plate.

In an exemplary embodiment, the top chassis may include an upper plate, and a side plate which extends from the upper plate. The contact unit may be disposed on an inner surface of only the upper plate.

According to another exemplary embodiment of the invention, a display device includes a display panel, a driving circuit, a bottom chassis and a top chassis assembly. The driving circuit drives the display panel. The bottom chassis supports the display panel. The top chassis assembly is combined with the bottom chassis to receive the display panel. The top chassis assembly includes a top chassis and a contact unit. The top chassis surrounds a non-display area of the display panel. The contact unit is disposed at an inner surface of the top chassis and contacts a pad part on the non-display area of the display panel.

In an exemplary embodiment, the contact unit may be a metal pad pattern. The metal pad pattern may be on the inner surface of the top chassis. The top chassis assembly may further include an insulation layer between the metal pad pattern and the top chassis. Moreover, the top chassis may include a nonconductive material.

In an exemplary embodiment, the contact unit may include a probe unit film. The probe unit film may include a probe thereon. The probe unit film may be attached to the inner surface of the top chassis.

In an exemplary embodiment, the top chassis may include an upper plate defining a bezel of the display device. A width of the upper plate may be less than or equal to about 1 millimeter.

In an exemplary embodiment, the top chassis may include an upper plate, and a side plate which extends from the upper plate. The contact unit may be disposed on an inner surface of the upper plate and on an inner surface of the side plate.

In an exemplary embodiment, the top chassis may include an upper plate, and a side plate which extends from the upper plate. The contact unit may be disposed on an inner surface of only the upper plate.

In an exemplary embodiment, the display device may further include a backlight assembly disposed below the display panel. The backlight assembly is received on the bottom chassis and provides the display panel with lights. The backlight assembly may include a printed circuit board, and a plurality of light-emitting diode packages emitting lights and on the printed circuit board.

In an exemplary embodiment, the display device may further include a backlight assembly disposed below the display panel. The backlight assembly is received on the bottom chassis and provides the display panel with lights. The backlight assembly may include a point light source, and a light guide plate guiding lights emitted from the point light source towards the display panel.

According to one or more embodiment of a top chassis assembly and a display device having the top chassis assembly, a contact unit is disposed at an inner surface of a top chassis so as to directly contact a pad part on a display substrate, so that a bonding area of a display panel may be omitted, thus a bezel of a display device including the display panel may be reduced.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "upper" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

In conventional display devices, a bezel width of a liquid crystal display ("LCD") device is wider due to an area required to bond a flexible printed circuit board ("FPCB") connected to a driving printed circuit board ("PCB") onto an array substrate of the LCD device, so that it is difficult to realize a narrow bezel. That is, the conventional LCD device may need an additional bonding area in order to bond the FPCB connected to the driving PCB and an LCD panel of the LCD device to each other, and thus it is difficult to reduce a bezel. Thus, the edge width of the LCD device, that is, bezel width is undesirably increased, and step coverage between the LCD panel and the bezel is undesirably increased, which might be an obstruction to the development of innovative design.

Hereinafter, the invention will be explained in detail with reference to the accompanying drawings.

Figure 1:
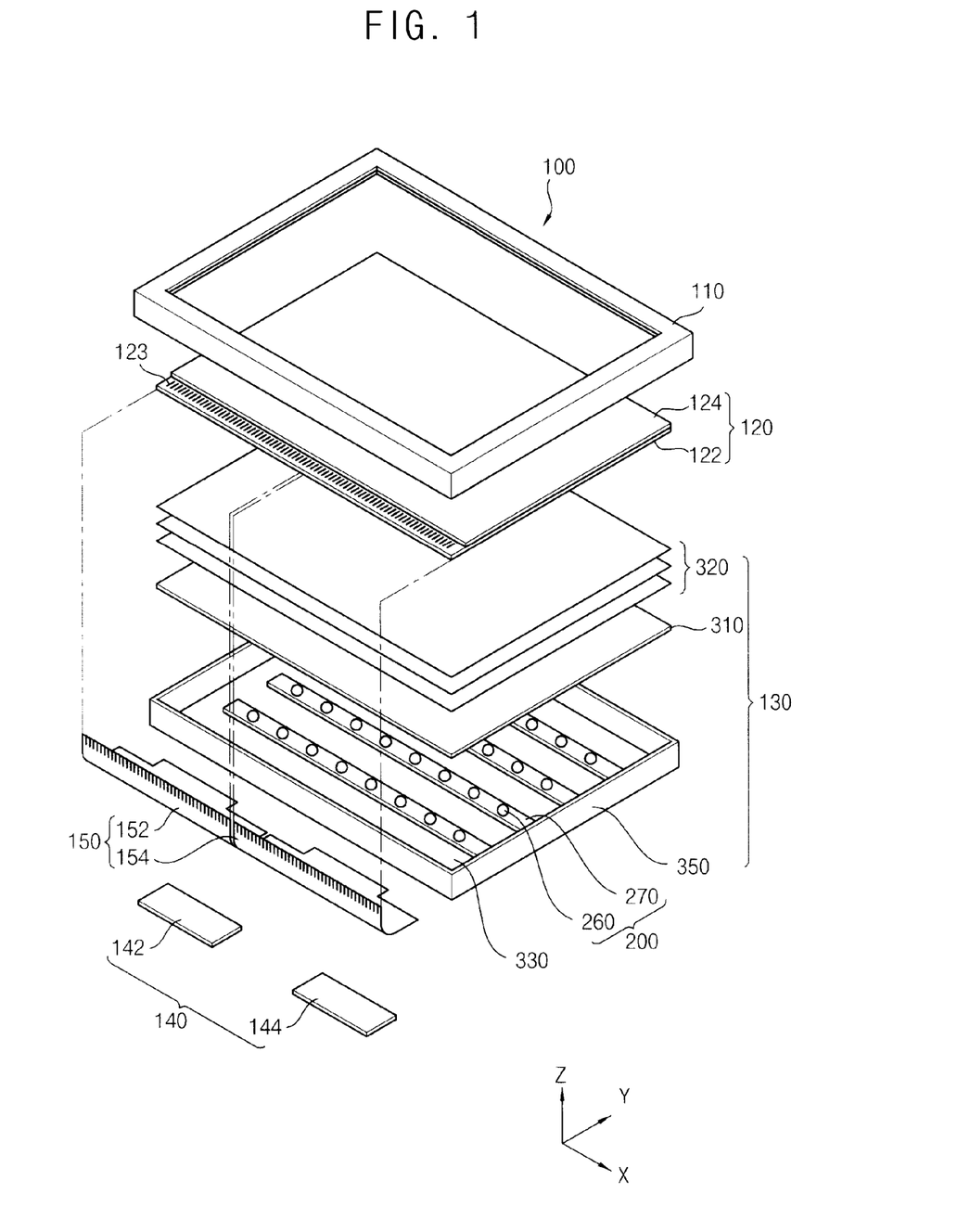
FIG. 1 is an exploded perspective view schematically showing an exemplary embodiment of a display device according to the invention.
Figure 2:
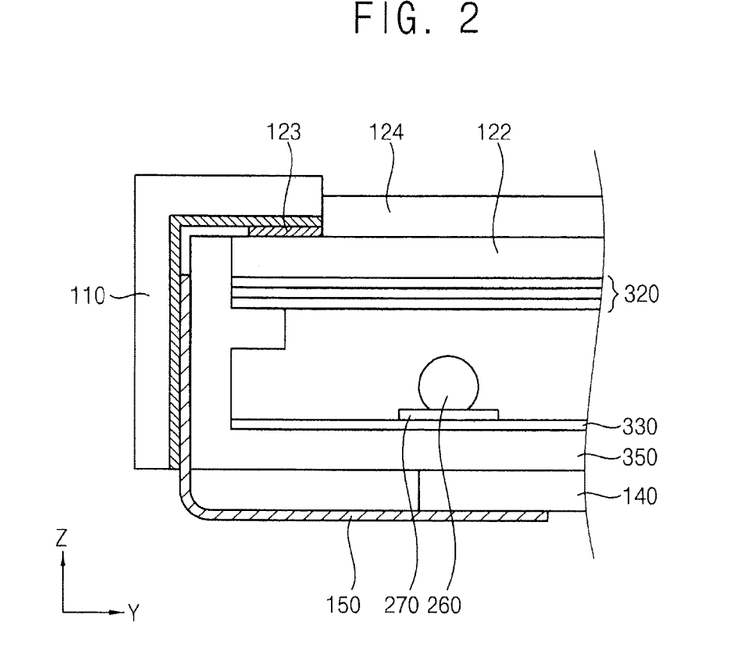
FIG. 2 is a cross-sectional view schematically showing the display device of FIG. 1.

FIG. 1 is an exploded perspective view schematically showing an exemplary embodiment of a display device according to the invention. FIG. 2 is a cross-sectional view schematically showing the display device of FIG. 1.

Referring to FIGS. 1 and 2, a display device 100 includes a top chassis assembly 110, a display panel 120, a backlight assembly 130, a driving PCB 140 and a FPCB 150. The display device 100 of FIG. 1 may be adapted to medium and large-scale display devices such as a television set, a monitor for a computer, etc., but is not limited thereto or thereby.

The top chassis assembly 110 is disposed on the display panel 120 to protect the display panel 120 from an external impact. The top chassis assembly 110 includes a window exposing a display area of the display panel 120. The window extends through an upper portion of the top chassis assembly 110, such as extending through a thickness of the upper portion. The top chassis assembly 110 includes a top chassis, and a contact unit disposed on an inner surface of the top chassis. The contact unit may be a metal pad pattern. The metal pad pattern may be on an insulation layer on an inner surface of the top chassis. In an exemplary embodiment of manufacturing a display device, the insulation layer may be formed on the inner surface of the top chassis by using a shadow mask.

The display panel 120 may include an array substrate 122, a color filter substrate 124 and a liquid crystal layer (not shown) interposed between the array substrate 122 and the color filter substrate 124. A planar size of the color filter substrate 124 may be smaller than that of the array substrate 122. Thus, an area of the array substrate 122 which is not covered by the color filter substrate 124 may be exposed. A pad part 123 is on the exposed area of the array substrate 122.

The array substrate 122 is a substrate including a thin-film transistor ("TFT") that is a switching element. A plurality of TFTs may be arranged in a matrix shape on the array substrate 122, but the invention is not limited thereto or thereby. In an exemplary embodiment, the TFT includes a source electrode connected to a data line, a gate electrode connected to a gate line and a drain electrode connected to a pixel electrode. The pixel electrode may include an optically transparent and electrically conductive material. A data pad part extended from the data line is disposed on a non-display area of the array substrate 122. Although not shown in FIGS. 1 and 2, a gate pad part extended from the gate line may be further disposed on a non-display area of the array substrate 122. The array substrate 122 may receive a signal and/or a voltage via the data pad part and/or the gate pad part.

The color filter substrate 124 faces the array substrate 122. The color filter substrate 124 is a substrate including a pixel electrode. A plurality of pixel electrodes may be arranged on the color filter substrate 124. The plurality of pixel electrodes may include a red pixel electrode, a green pixel electrode and a blue pixel electrode for realizing a color, but the invention is not limited thereto or thereby. The pixel electrodes may have a thin-film type structure. The color filter substrate 124 may further include a common electrode opposite to the pixel electrode which is on the array substrate 122. The common electrode may include an optically transparent and electrically conductive material.

When a voltage is applied to the gate electrode of the TFT to turn on the TFT in the display panel 120, an electric field is formed between the pixel electrode and the common electrode. An arrangement of liquid crystal molecules of the liquid crystal layer disposed between the array substrate 122 and the color filter substrate 124 is altered to change optical transmissitivity, so that an image is displayed.

The display panel 120 may further include a first polarization film (not shown) disposed below the array substrate 122 and a second polarization film (not shown) disposed on the color filter substrate 124. The first polarization film has a transmitting axis of a first direction to polarize lights. The second polarization film has a transmitting axis of a second direction to polarize lights. In one exemplary embodiment, a transmitting axis of the first polarization film and a transmitting axis of the second polarization film may be substantially perpendicular to each other, but is not limited thereto or thereby.

The backlight assembly 130 is disposed below the display panel 120 to provide the display panel 120 with lights. Generally, a backlight assembly is classified into a direct type backlight assembly and an edge type backlight assembly. In the direct type backlight assembly, a plurality of light sources are positioned on a lower surface of a diffusion plate, and thus light travels to a back surface of an LCD panel. On the other hand, the edge type backlight assembly includes a plurality of light sources positioned facing a light incident side surface of a light guide plate, and a plurality of optical sheets are between the LCD panel and the light guide plate. In the edge type backlight assembly, the light guide plate converts line light or point light from the light sources into planar light, and the optical sheets allow the planar light to travel to a back surface of the LCD panel.

According to the exemplary embodiment shown in FIG. 1, the backlight assembly 130 is a direct type backlight assembly. The backlight assembly 130 may include a light source module 200, optical sheets 320, a diffusion plate 310, a reflection plate 330 and a receiving container 350.

The light source module 200 may include a plurality of light-emitting diode packages 260 emitting lights, and a PCB 270 on which the light-emitting diode packages 260 are mounted. A signal wiring (not shown) providing a driving voltage to the light-emitting diode packages 260 is on the PCB 270. The light source module 200 may be disposed on a bottom surface of the receiving container 350. In one exemplary embodiment, for example, the light source module 200 may be disposed on the bottom surface of the receiving container 350 and have a longitudinal axis extended parallel with a long side of the display panel 120. Alternatively, the light source module 200 may be disposed on the bottom surface of the receiving container 350 where the longitudinal axis of the light source module 200 is parallel with a short side of the display panel 120.

The optical sheets 320 are disposed on the diffusion plate 310 to enhance luminance characteristics of lights emitted from the diffusion plate 310. The optical sheets 320 may include a diffusion sheet again diffusing the diffused lights from the diffusion plate 310 and a light condensing sheet condensing the diffused lights from the diffusion sheet to a perpendicular direction with respect to the display panel 120. In one exemplary embodiment, for example, the light condensing sheet may include a first prism sheet condensing lights in a longitude direction and a second prism sheet condensing lights in a latitude direction.

The reflection plate 330 is disposed below the light source module 200 to reflect lights incident from the light source module 200.

The receiving container 350 is configured by a bottom portion, and plural side portions extended from edges of the bottom portion, to form a receiving space. The receiving container 350 receives the reflection plate 330, the diffusion plate 310, the light source module 200 and the optical sheets 320. The light source module 200 may be disposed at a first side portion of the receiving container 350. Alternatively, the light source module 200 may be disposed at the bottom portion of the receiving container 350.

The backlight assembly 130 may further include a mold frame (not shown). The mold frame is disposed between the display panel 120 and the optical sheets 320 to support the display panel 120 together with the receiving container 350.

Moreover, the mold frame may secure the optical sheets 320, the diffusion plate 310 and the reflection plate 330 to the receiving container 350.

The driving PCB 140 is connected to the FPCB 150 to provide the display panel 120 with a driving signal for driving the display panel 120 via the FPCB 150. In the exemplary embodiment, the collective driving PCB 140 includes a first driving PCB 142 and a second driving PCB 144, however, the driving PCB 140 may include only one PCB or may include more than two PCBs.

The FPCB 150 contacts a contact unit disposed at the top chassis assembly 110, such that the top chassis assembly 110 is connected to the PCB 140. In one exemplary embodiment, where the collective driving PCB 140 includes the first and second driving PCBs 142 and 144, the collective FPCB 150 may include a first FPCB 152 and a second FPCB 154. However, the FPCB 150 may include only one FPCB or may include more than two FCBs.

The FPCB 150 applies a driving signal provided from the driving PCB 140 to the display panel 120 through the contact unit of the top chassis assembly 110. The FPCB 150 may include a bend at a lower side (or a rear surface) of the bottom chassis 350. In one exemplary embodiment, as an example, the FPCB 150 may include a resin material having a flexible property such that the FPCB 150 can be deformed and bent at the lower side of the bottom chassis 350.

Figure 3:
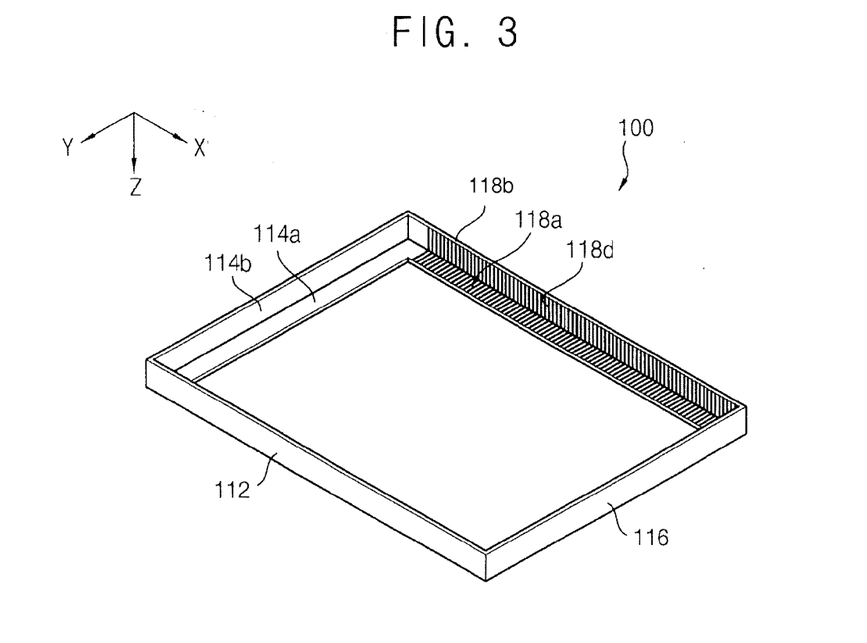
FIG. 3 is a rear perspective view schematically showing an exemplary embodiment of a top chassis assembly of FIG. 1.
Figure 4:
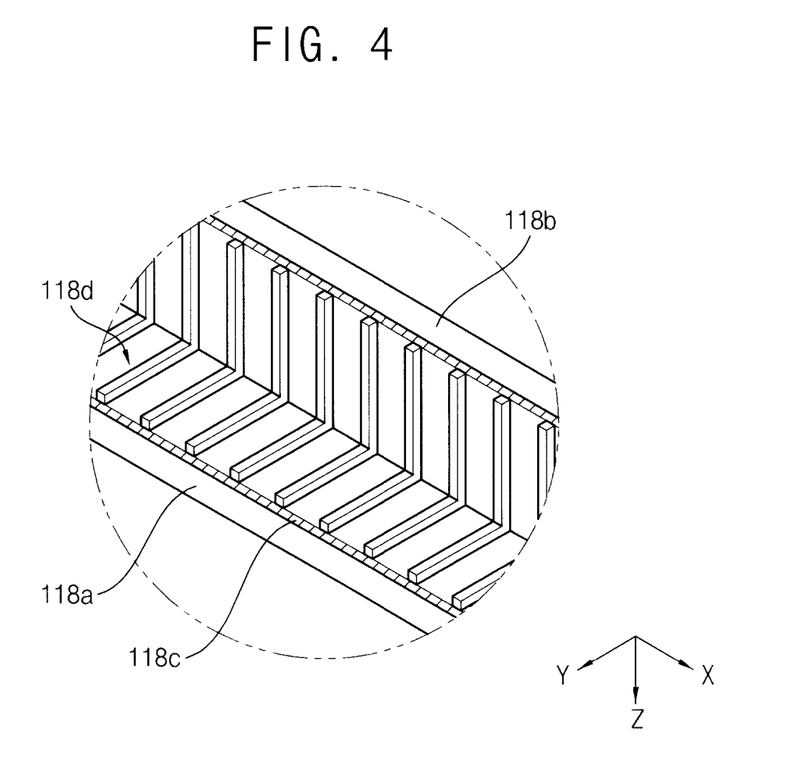
FIG. 4 is an enlarged view schematically showing a portion of the top chassis assembly including a contact unit thereon.

FIG. 3 is a rear perspective view schematically showing an exemplary embodiment of the top chassis assembly 110 of FIG. 1. FIG. 4 is an enlarged view schematically showing a portion of the top chassis assembly including a contact unit thereon.

Referring to FIGS. 1 to 4, the top chassis assembly 110 includes a top chassis surrounding a non-display area of a display panel, and a contact unit 118d disposed on an inner surface of the top chassis to contact a pad part on the non-display area of the display panel.

The top chassis includes a first upper plate (reference numeral is not indicated), a second upper plate 114a, a third upper plate (reference numeral is not indicated), a fourth upper plate 118a, a first side plate 112, a second side plate 114b, a third side plate 116 and a fourth side plate 118b to form a rectangular frame shape.

The first upper plate is disposed in an XY-plane and has a longitudinal axis which is extended in an X-axis direction. The second upper plate 114a is disposed in the XY-plane and has a longitudinal axis which is extended in a Y-axis direction. A first end portion of the second upper plate 114a is connected to a first end portion of the first upper plate. The third upper plate is disposed in the XY-plane and has a longitudinal axis which is extended in the Y-axis direction. A first end portion of the third upper plate is connected to a second end portion of the first upper plate. The fourth upper plate 118a is disposed in the XY-plane and has a longitudinal axis which is extended in the X-axis direction. A first end portion of the fourth upper plate 118a is connected to a second end portion of the second upper plate 114a, and a second end portion of the fourth upper plate 118a is connected to a second end portion of the third upper plate.

A width of the first, second, third and fourth upper plates is taken in the X-Y plane and perpendicular to the longitudinal axis. The first, second, third and fourth upper plates may have a width of no more than about 1 millimeter (mm).

The first side plate 112 is bent from the first upper plate in a Z-axis direction. The second side plate 114b is bent from the second upper plate 114a in the Z-axis direction. The third side plate 116 is bent from the third upper plate in the Z-axis direction. The fourth side plate 118b is bent from the fourth upper plate 118a in the Z-axis direction.

In the exemplary embodiment, it is described that first to fourth upper plates and first to fourth side plates form one unit to define a single, unitary, indivisible top chassis, however, the top chassis may be configured in various manners. In an alternative exemplary embodiment, for example, four separate units may be combined to form a top chassis. That is, a first upper plate and a first side plate form one unit, and a second upper plate and a second side plate form one unit. In addition, a third upper plate and a third side plate form one unit, and a fourth upper plate and a fourth side plate form one unit. As another exemplary embodiment, two separate units may be combined to form a top chassis. That is, first and second upper plates and first and second side plates form one unit, and third and fourth upper plates and third and fourth side plates form another unit.

The contact unit 118d is on an inner surface of the fourth upper plate 118a and on an inner surface of the fourth side plate 118b. In the exemplary embodiment, the contact unit 118d includes plural metal pad patterns. The metal pad patterns may include a first portion having a longitudinal axis which is parallel with the Y-axis direction, and a second portion having a longitudinal axis which is parallel with the Z-axis direction. The metal pad patterns 118d may be have a bar code shape or pattern in the plan view.

When the top chassis includes a metal material, an insulation layer 118c may be between the top chassis and the metal pad pattern of the contact unit 118d. The insulation layer 118c may have a thickness taken perpendicular to the respective surface of the top chassis, where the thickness is sufficient for providing an electrical insulation between the metal pad pattern of the contact unit 118d and the top chassis.

In order to maximize an electrical insulation between the metal pad pattern of the contact unit 118d and the top chassis, the top chassis may include a non-conductive material such as polycarbonate ("PC"), but is not limited thereto or thereby.

In the exemplary embodiment, it is described that the metal pad pattern is on the inner surface of the top chassis in correspondence with an area of the array substrate including the data pad part. Alternatively, when the array substrate includes a gate pad part, the metal pattern may be further on an inner surface of the top chassis in correspondence with the gate pad part.

As described above, a metal pad pattern is on an inner surface of a top chassis so as to directly contact a pad part on a display substrate (e.g., an array substrate), so that an additional bonding area for connecting to a FCPB and the pad part may be omitted. Since the additional bonding area is omitted, a bezel of a display device may be reduced.

Figure 5:
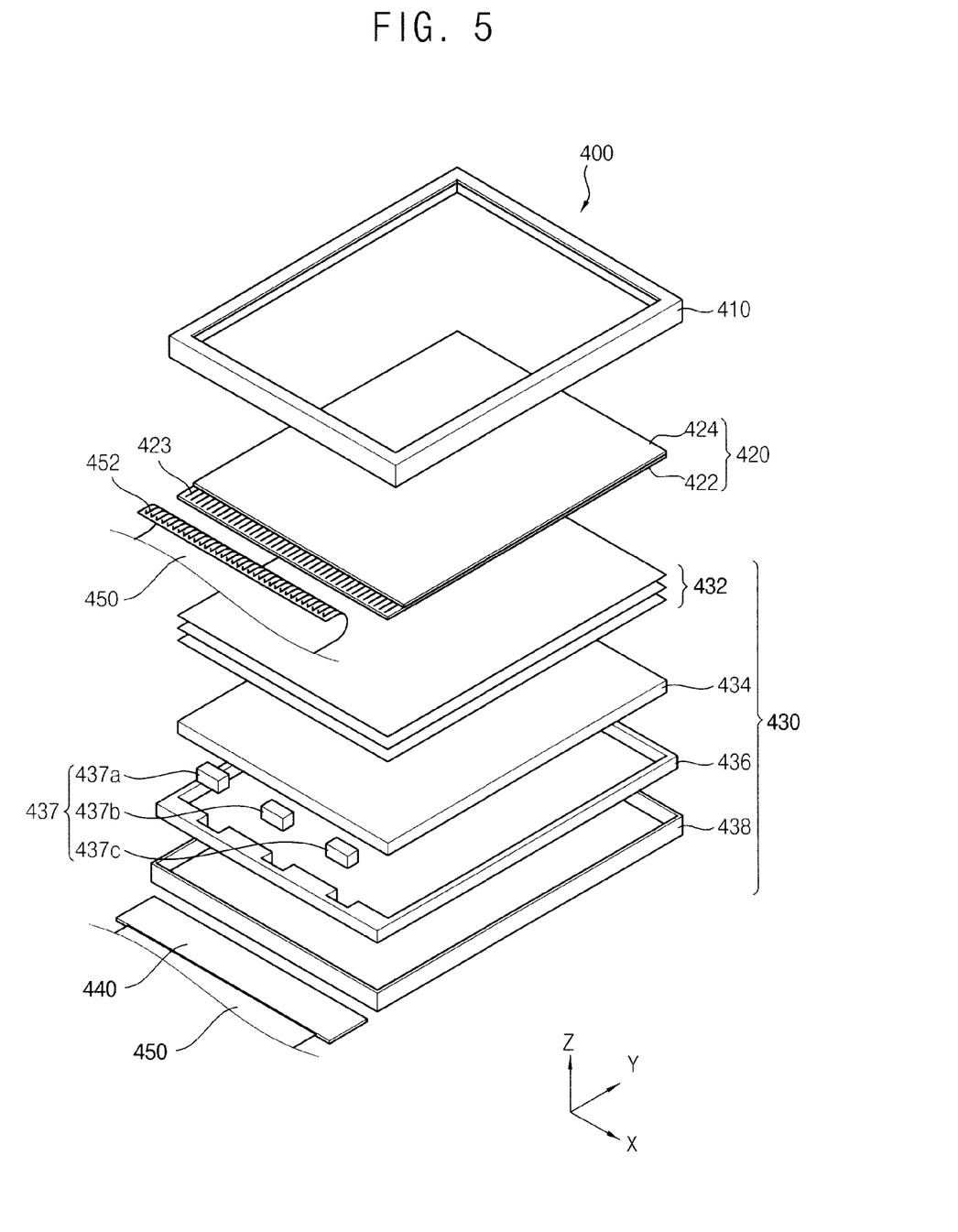
FIG. 5 is an exploded perspective view schematically showing another exemplary embodiment of a display device according to the invention.

FIG. 5 is an exploded perspective view schematically showing another exemplary embodiment of a display device according to the invention.

Referring to FIG. 5, a display device 400 includes a top chassis assembly 410, a display panel 420, a backlight assembly 430 and a driving PCB 440. The display device 400 of FIG. 5 may be adapted to medium and small-scale display devices such as a mobile phone, a smart phone, etc., but is not limited thereto or thereby.

The top chassis assembly 410 surrounds a non-display area of the display panel 420 which is disposed on the backlight assembly 430, to protect the display panel 420 from an external impact. The top chassis assembly 410 includes a contact unit which contacts a pad part on the non-display area of the display panel 420, is disposed on an inner surface of the top chassis assembly 410. The contact unit may be a probe unit film 450 including plural probes thereon.

The display panel 420 may include an array substrate 422, a color filter substrate 424 and a liquid crystal layer (not shown) interposed between the array substrate 422 and the color filter substrate 424. In the exemplary embodiment, the display panel 420 is the same as the display panel 120 of FIG. 1, and thus any repetitive detailed explanation may hereinafter be omitted.

According to the exemplary embodiment shown in FIG. 5, the backlight assembly 430 is an edge type backlight assembly. The backlight assembly 430 includes optical sheets 432, a light guide plate 434, a mold frame 436, a point light source 437 and a bottom chassis 438. The backlight assembly 430 is disposed below the display panel 420 to provide the display panel 420 with lights.

The optical sheets 432 enhance luminance characteristics of lights through the light guide plate 434, and provide the enhanced lights to the display panel 420. The optical sheets 432 may include a diffusion sheet, a light condensing sheet, etc., in order to enhance luminance characteristics of lights which have passed through the light guide plate 434. The diffusion sheet is disposed on the light guide plate 434 to diffuse lights emitted from the light guide plate 434. The light condensing sheet is disposed on the diffusion sheet to condense lights that are emitted from the diffusion sheet to a perpendicular direction with respect to the display panel 420. In one exemplary embodiment, for example, the light condensing sheet may include a first prism sheet condensing lights in a longitude direction and a second prism sheet condensing lights in a latitude direction.

The light guide plate 434 is disposed below the display panel 420. The light guide plate 434 may have a plate shape. The light guide plate 434 is disposed at a first side of the point light source 437 and facing a light-emitting surface of the point light source 437. The light guide plate 434 may guide lights generated and emitted from a point light source 437 to exit toward the display panel 420. In one exemplary embodiment, for example, the light guide plate 434 may include a transparent material in order to reduce light loss.

The mold frame 436 is disposed at a peripheral upper portion of the bottom chassis 438, and is combined with the display panel 420 and the backlight assembly 430 in a vertical direction. That is, the mold frame 436 may play a role of guiding and supporting the display panel 420. In one exemplary embodiment, for example, the mold frame 436 may have a rectangular frame shape.

The point light source 437 is positioned at a first side of the light guide plate 434 to emit lights toward the light guide plate 434. The point light source 437 may include a first light-emitting diode ("LED") 437a, a second LED 437b and a third LED 437c in order to realize thin thickness and low power consumption of the display device 400. In the exemplary embodiment, three LEDs are employed, however, the number of the LEDs may be decreased or increased in accordance with a size of the display panel 420 and a required luminance. The first to third LEDs 437a, 437b and 437c may be mounted on a light source control FPCB (not shown).

The bottom chassis 438 may include a bottom portion of a rectangular shape, and side portions extended from an edge of the bottom portion. The bottom portion and the side portions may form a receiving space to receive a FPCB (not shown) on which the point light source 437 is disposed, the light guide plate 434 and the optical sheets 432. The bottom chassis 438 includes, for example, a metal material having superior strength and low deformation.

The backlight assembly 430 may further include a reflection plate (not shown) disposed on the bottom portion of the bottom chassis 438 to reflect leaked lights from the light guide plate 434. The reflection plate may enhance a light usage efficiency within the display panel 400.

The driving PCB 440 is connected to the probe unit film 450 to provide the display panel 420 with a driving signal for driving the display panel 120 via the probe unit film 450.

The probe unit film 450 may be bent to be disposed at a rear surface of the bottom chassis 438.

Figure 6:
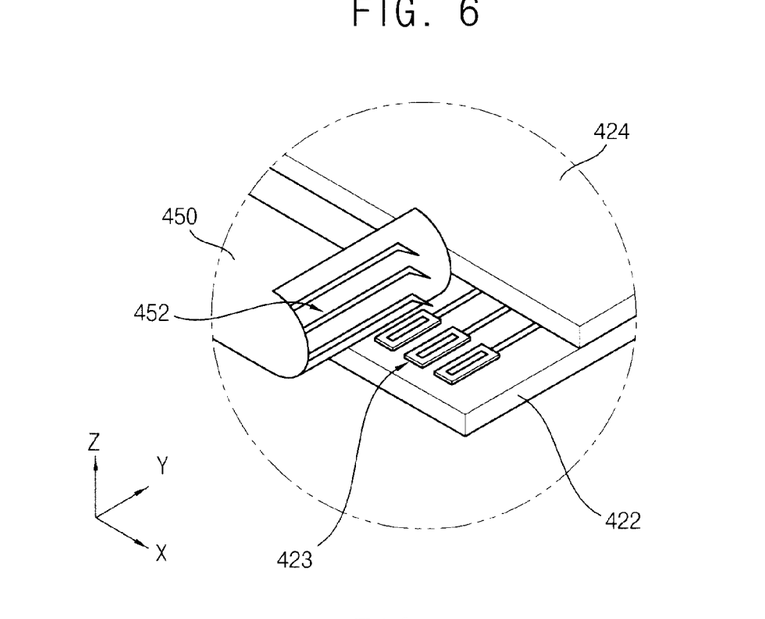
FIG. 6 is a perspective view for explaining an exemplary embodiment of an electrical contact between a probe unit film and an array substrate of FIG. 5.
Figure 7:
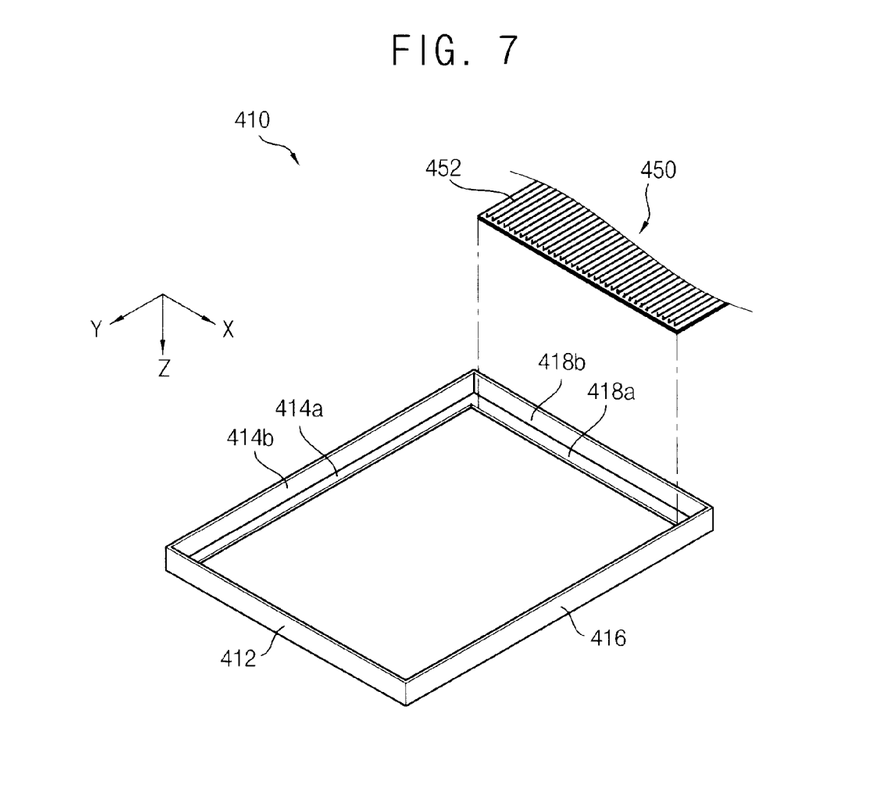
FIG. 7 is a rear perspective view schematically showing an exemplary embodiment of a top chassis assembly of FIG. 5.

FIG. 6 is a perspective view explaining an exemplary embodiment of an electrical contact between the probe unit film and an array substrate of FIG. 5. FIG. 7 is a rear perspective view schematically showing an exemplary embodiment of the top chassis assembly of FIG. 5.

Referring to FIGS. 6 and 7, a probe 452 is disposed on a first surface of the probe unit film 450 to contact a pad part 423 on the array substrate 422. A plurality of probes 452 may be disposed on the first surface of the probe unit film 450. Each of the probes 452 has a body attached to a base film or the probe unit film 450, and a head protruding from the body to contact the pad part 423. A pitch or distance between adjacent probes 452 may be substantially equal to a pitch between the adjacent pad parts on the array substrate 422. A second surface of the probe unit film 450 is coupled to an inner surface of the top chassis assembly 410. In the exemplary embodiment, the second surface of the probe unit film 450 is attached to an inner surface of the fourth upper plate 418a and an inner surface of the fourth side plate 418b.

Figure 8:
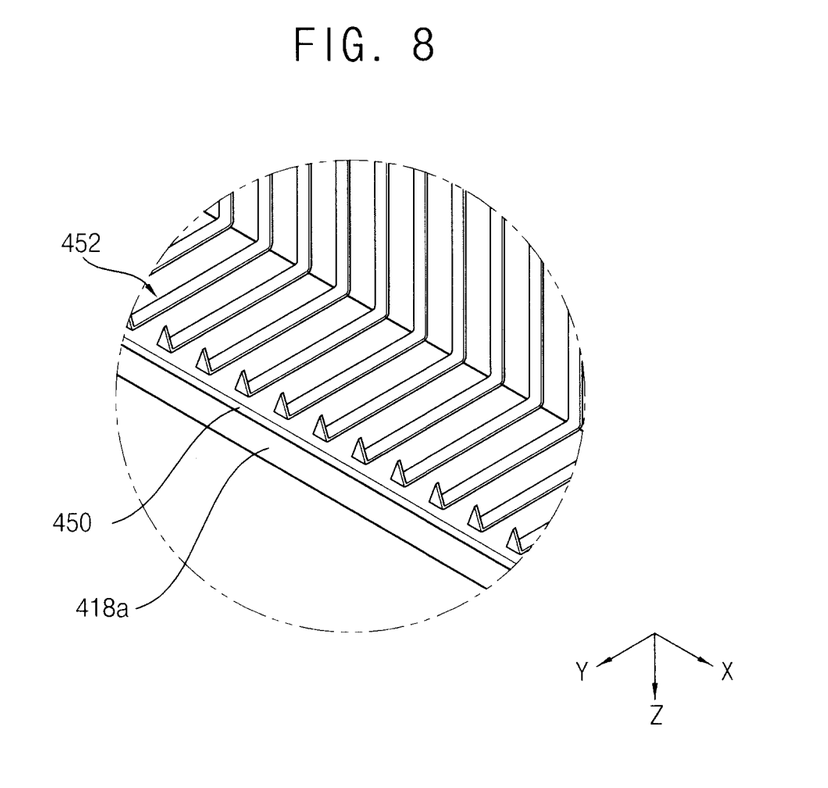
FIG. 8 is an enlarged view schematically showing a portion of the top chassis assembly including a probe unit film attached thereto.

FIG. 8 is an enlarged view schematically showing a portion of the top chassis assembly including the probe unit film attached thereto.

Referring to FIGS. 5 to 8, a top chassis assembly 410 includes a top chassis surrounding a non-display area of the display panel 420 and a probe unit film 450 attached to an inner surface of the top chassis. The probe unit film 450 contacts the pad part 423 on the non-display area of the display panel 420.

The top chassis includes a first upper plate (reference numeral is not indicated), a second upper plate 414a, a third upper plate (reference numeral is not indicated), a fourth upper plate 418a, a first side plate 412, a second side plate 414b, a third side plate 416 and a fourth side plate 418b to form a rectangular frame shape.

The first upper plate is disposed in an XY-plane and has a longitudinal axis which is extended in an X-axis direction. The second upper plate 414a is disposed in the XY-plane and has a longitudinal axis which is extended in a Y-axis direction. A first end portion of the second upper plate 414a is connected to a first end portion of the first upper plate. The third upper plate is disposed in the XY-plane and has a longitudinal axis which is extended in the Y-axis direction. A first end portion of the third upper plate is connected to a second end portion of the first upper plate. The fourth upper plate 418a is disposed in the XY-plane and has a longitudinal axis which is extended in the X-axis direction. A first end portion of the fourth upper plate 418a is connected to a second end portion of the second upper plate 414a, and a second end portion of the fourth upper plate 418a is connected to a second end portion of the third upper plate. The first, second, third and fourth upper plates may have a width of no more than about 1 mm.

The first side plate 412 is bent from the first upper plate in a Z-axis direction. The second side plate 414b is bent from the second upper plate 414a in the Z-axis direction. The third side plate 416 is bent from the third upper plate in the Z-axis direction. The fourth side plate 418b is bent from the fourth upper plate 418a in the Z-axis direction.

In the exemplary embodiment, it is described that first to fourth upper plates and first to fourth side plates form one unit to define a single, unitary, indivisible top chassis, however, the top chassis may be configured in various manners. In an alternative exemplary embodiment, for example, four separate units may be combined to form a top chassis. That is, a first upper plate and a first side plate form one unit, and a second upper plate and a second side plate form one unit. In addition, a third upper plate and a third side plate form one unit, and a fourth upper plate and a fourth side plate form one unit. As another exemplary embodiment, two separate units may be combined to form a top chassis. That is, first and second upper plates and first and second side plates form one unit, and third and fourth upper plates and third and fourth side plates form another unit.

The probe unit film 450 is attached to an inner surface of the fourth upper plate 418a and to an inner surface of the fourth side plate 418b. A first end portion of the probe unit film 450 contacts the pad part 423 on an array substrate 422, and a second end portion of the probe unit film 450 is connected to the driving PCB 440.

In the exemplary embodiment, since the probe unit film 450 is attached to the inner surface of the fourth upper plate 418a and the inner surface of the fourth side plate 418b, the probe unit film 450 may be bent about 90 degrees.

In one exemplary embodiment, a portion or an entire of the fourth side plate 418b may be omitted from the top chassis of FIG. 8. When a portion of the fourth side plate 418b is omitted from the top chassis, and the probe unit film 450 is attached to the pad part 423 and the driving PCB 440, a radius of curvature corresponding to the probe unit film 450 may be increased in comparison with a radius of curvature corresponding to the probe unit film 450 attached to the fourth side plate 418b and bent toward the fourth upper plate 418a. When the radius or curvature is increased, damage or cutting of the probes 452 may be decreased.

In the exemplary embodiment, it is described that a probe unit film is attached to an inner surface of a top chassis in correspondence with an area of the array substrate 422 including a data pad part. However, when the array substrate 422 includes a gate pad part, an additional probe unit film may be further attached to an inner surface of the top chassis in correspondence with the gate pad part.

As described above, in the another exemplary embodiment of the invention, a probe unit film including a probe is thereon is attached to an inner surface of a top chassis so as to directly contact a pad part on a display substrate (e.g., an array substrate), so that an additional bonding area for connecting to a FPCB and the pad part may be omitted. Since the additional bonding area is omitted, a bezel of a display device may be reduced.

As described above, a top chassis assembly and a display device according to the invention may be used as large-scale display devices, such as a billboard. In one exemplary embodiment, for example, when a large-scale advertising plate such as a billboard includes a plurality of the display devices, bezels of each of the display devices may be reduced. Thus, a problem of a perceived separation of a display screen may be reduced or effectively prevented.

Moreover, a top chassis assembly and a display device according to the invention may be used as medium and small-scale display devices such as a mobile phone, a smart phone, etc. In one exemplary embodiment, for example, when the medium or small-scale display device includes the display device, since a bezel of the display device is decreased, an ability to grip the display device by a user may be enhanced and prominence of a display screen may be increased.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A top chassis assembly comprising:
a top chassis surrounding a non-display area of a display panel,
the non-display area comprising a pad part through which a signal is provided to the display panel; and
a contact unit on an inner surface of the top chassis and in direct contact with the pad part of the display panel, wherein
the contact unit comprises a metal pad pattern, and
the metal pad pattern is on the inner surface of the top chassis.

2. The top chassis assembly of claim 1, further comprising:
an insulation layer between the metal pad pattern and the top chassis.

3. The top chassis assembly of claim 1, wherein the top chassis comprises a nonconductive material.

4. The top chassis assembly of claim 3, wherein the nonconductive material comprises polycarbonate.

5. The top chassis assembly of claim 1, wherein
the contact unit comprises a probe unit film, the probe unit film comprising a conductive probe thereon, and
the probe unit film is attached to the inner surface of the top chassis.

6. The top chassis assembly of claim 1, wherein
the top chassis comprises an upper plate defining a bezel of a display device which includes the display panel, and
a width of the upper plate is less than or equal to about 1 millimeter.

7. The top chassis assembly of claim 1, wherein the contact unit has a barcode shape.

8. The top chassis assembly of claim 1, wherein
the top chassis comprises an upper plate, and a side plate which extends from the upper plate, and
the contact unit extends from an inner surface of the upper plate and extends from an inner surface of the side plate.

9. The top chassis assembly of claim 1, wherein
the top chassis comprises an upper plate, and a side plate which extends from the upper plate, and
the contact unit extends from an inner surface of only the upper plate.

10. A display device comprising:
a display panel comprising a non-display area, and a pad part on the non-display area, wherein a signal is provided to the display panel via the pad part;

a driving circuit which drives the display panel;
a bottom chassis which supports the display panel; and
a top chassis assembly which is combined with the bottom chassis and receives the display panel, the top chassis assembly comprising:
  a top chassis surrounding the non-display area of the display panel; and
  a contact unit on an inner surface of the top chassis and in direct contact with the
pad part
wherein
the contact unit comprises a metal pad pattern, and
the metal pad pattern is on the inner surface of the top chassis.

11. The display device of claim 10, wherein the top chassis assembly further comprises an insulation layer between the metal pad pattern and the top chassis.

12. The display device of claim 10, wherein the top chassis comprises a nonconductive material.

13. The display device of claim 10, wherein
the contact unit comprises a probe unit film, the probe unit film comprising a conductive probe thereon, and
the probe unit film is attached to the inner surface of the top chassis.

14. The display device of claim 10, wherein
the top chassis comprises an upper plate defining a bezel of the display device,
a width of the upper plate is less than or equal to about 1 millimeter.

15. The display device of claim 10, wherein
the top chassis comprises an upper plate, and a side plate which extends from the upper plate, and
the contact unit extends from an inner surface of the upper plate and extends from an inner side surface of the side plate.

16. The display device of claim 10, wherein
the top chassis comprises an upper plate, and a side plate which extends from the upper plate, and
the contact unit extends from an inner surface of only the upper plate.

17. The display device of claim 10, further comprising a backlight assembly below the display panel,
  wherein the backlight assembly is received on the bottom chassis and provides the display panel with lights, and
  the backlight assembly comprises a printed circuit board, and a plurality of light-emitting diode packages on the printed circuit board, the plurality of light-emitting diode packages emitting the lights.

18. The display device of claim 10, further comprising a backlight assembly below the display panel,
  wherein the backlight assembly is received on the bottom chassis and provides the display panel with lights, and
  wherein the backlight assembly comprises a point light source, and a light guide plate which guides the lights emitted from the point light source towards the display panel.

* * * * *